(12) United States Patent
Tsai et al.

(10) Patent No.: US 12,721,074 B2
(45) Date of Patent: Aug. 25, 2026

(54) PATTERNING METHOD

(71) Applicant: United Microelectronics Corp., Hsinchu (TW)

(72) Inventors: Yi Lin Tsai, Tainan City (TW); Chih-Hsien Tang, Taipei City (TW)

(73) Assignee: United Microelectronics Corp., Hsinchu (TW)

( * ) Notice: Subject to any disclaimer, the term of this patent is extended or adjusted under 35 U.S.C. 154(b) by 127 days.

(21) Appl. No.: 18/959,674

(22) Filed: Nov. 26, 2024

(65) Prior Publication Data

US 2026/0114200 A1 Apr. 23, 2026

(30) Foreign Application Priority Data

Oct. 21, 2024 (TW) ................................ 113139957

(51) Int. Cl.
*B29C 59/02* (2006.01)
*G03F 7/00* (2006.01)
(Continued)

(52) U.S. Cl.
CPC .......... *H10P 50/695* (2026.01); *B29C 59/022* (2013.01); *B29C 59/026* (2013.01);
(Continued)

(58) Field of Classification Search
CPC ..... B29C 59/02; B29C 59/022; B29C 59/026; G03F 7/0002; G03F 7/0035; H10P 50/69;
(Continued)

(56) References Cited

U.S. PATENT DOCUMENTS 10,031,414 B2 7/2018 Isobayashi
2006/0230959 A1* 10/2006 Meijer .................. B82Y 40/00
101/368

(Continued)

FOREIGN PATENT DOCUMENTS

JP 2013211450 10/2013
JP 2014175434 9/2014

(Continued)

OTHER PUBLICATIONS

"Office Action of Taiwan Counterpart Application", issued on Nov. 27, 2024, p. 1-p. 5.

*Primary Examiner* — Michael A Tolin
(74) *Attorney, Agent, or Firm* — JCIPRNET

(57) ABSTRACT

A patterning method including the following steps is provided. A first template including at least one first main pattern, first dummy patterns, and second main patterns is provided. The first dummy patterns are located aside the first main pattern. A density of the first main pattern is less than a density of the second main patterns. A first imprint material is provided on a first substrate. The first imprint material is imprinted by using the first template to form a first imprint layer. The first substrate is etched by using the first imprint layer as a mask to form a second template. A second imprint material is provided on a material layer. The second imprint material is imprinted by using the second template to form a second imprint layer. The material layer is etched by using the second imprint layer as a mask to form a patterned material layer.

20 Claims, 16 Drawing Sheets

(51) Int. Cl.
*H10P 50/00* (2026.01)
*H10P 76/20* (2026.01)

(52) U.S. Cl.
CPC .......... *G03F 7/0002* (2013.01); *G03F 7/0035* (2013.01); *H10P 50/71* (2026.01); *H10P 50/73* (2026.01); *H10P 76/204* (2026.01)

(58) Field of Classification Search
CPC .... H10P 50/691; H10P 50/692; H10P 50/695; H10P 50/696; H10P 50/71; H10P 50/73; H10P 76/00; H10P 76/20; H10P 76/204; H10P 76/2041; H10P 76/2045; H01L 21/027; H01L 21/0271; H01L 21/0273; H01L 21/0274; H01L 21/0277; H01L 21/308; H01L 21/3081; H01L 21/3086; H01L 21/3088
See application file for complete search history.

(56) References Cited

U.S. PATENT DOCUMENTS

| | | | | |
|---|---|---|---|---|
| 2011/0159134 A1* | 6/2011 | Hiroshima | ............ | B81C 99/009<br>425/385 |
| 2015/0360412 A1* | 12/2015 | Isobayashi | ............ | G03F 7/0002<br>264/293 |
| 2024/0319586 A1* | 9/2024 | Kamita | ................. | G03F 7/0002 |

FOREIGN PATENT DOCUMENTS

| | | |
|---|---|---|
| TW | 201344960 | 11/2013 |
| TW | 201535044 | 9/2015 |
| TW | 201827922 | 8/2018 |
| TW | 202206939 | 2/2022 |
| TW | 202343134 | 11/2023 |

* cited by examiner

H1
110a
108
IP2
IP2
IP2
H2
IP2
IP2
H3
IP2
IP2
IP2
RLT2

108a
MP5
MP6
MP6
MP6

PATTERNING METHOD

CROSS-REFERENCE TO RELATED APPLICATION

This application claims the priority benefit of Taiwan application serial no. 113139957, filed on Oct. 21, 2024. The entirety of the above-mentioned patent application is hereby incorporated by reference herein and made a part of this specification.

BACKGROUND

Technical Field

The invention relates to a semiconductor manufacturing process, and particularly relates to a patterning method.

Description of Related Art

Currently, an imprint material layer on a material layer is imprinted by using the template to form an imprint layer on the material layer. Then, the material layer is etched by using the imprint layer as a mask to form a patterned material layer. However, since the pattern density of the isolated region of the template is less than the pattern density of the dense region of the template, when the imprint material layer is imprinted, the residual layer thickness (RLT) in the isolated region is greater than the residual layer thickness in the dense region. As a result, when the material layer is etched by using the imprint layer as a mask, a pattern with the expected critical dimension cannot be obtained.

SUMMARY

The invention provides a patterning method, and the patterned material layer formed by the patterning method can have a pattern that conforms to the expected critical dimension.

The invention proposes a patterning method, which includes the following steps. A first template is provided. The first template includes at least one first main pattern, first dummy patterns, and second main patterns. The at least one first main pattern is located in the first region of the first template. The first dummy patterns are located in the first region of the first template. The first dummy patterns are located aside the at least one first main pattern. The second main patterns are located in the second region of the first template. The density of the at least one first main pattern in the first region is less than the density of the second main patterns in the second region. A first imprint material is provided on a first substrate. The first imprint material is imprinted by using the first template to form a first imprint layer. The first substrate is etched by using the first imprint layer as a mask to form a second template. A second imprint material is provided on a material layer. The second imprint material is imprinted by using the second template to form a second imprint layer. The material layer is etched by using the second imprint layer as a mask to form a patterned material layer. The patterned material layer includes at least one third main pattern corresponding to the at least one first main pattern and fourth main patterns corresponding to the second main patterns.

According to an embodiment of the invention, in the patterning method, the critical dimension (CD) of each of the first dummy patterns may be smaller than the critical dimension of the at least one first main pattern and the critical dimension of each of the second main patterns.

According to an embodiment of the invention, in the patterning method, the first dummy patterns may be located on two sides of the at least one first main pattern.

According to an embodiment of the invention, in the patterning method, all the first dummy patterns may be closer to the at least one first main pattern than to the second main patterns.

According to an embodiment of the invention, in the patterning method, a portion of the first dummy patterns may be closer to the at least one first main pattern than to the second main patterns. Another portion of the first dummy patterns may be closer to the second main patterns than to the at least one first main pattern.

According to an embodiment of the invention, in the patterning method, the method of forming the first template may include the following steps. A second substrate is provided. A patterned mask layer is formed on the second substrate. The patterned mask layer may include at least one fifth main pattern, second dummy patterns, and sixth main patterns. The at least one fifth main pattern is located in the third region of the patterned mask layer. The at least one first main pattern may correspond to the at least one fifth main pattern. The second dummy patterns are located in the third region of the patterned mask layer. The second dummy patterns are located aside the at least one fifth main pattern. The first dummy patterns may correspond to the second dummy patterns. The sixth main patterns are located in the fourth region of the patterned mask layer. The second main patterns may correspond to the sixth main patterns. The density of the at least one fifth main pattern in the third region may be less than the density of the sixth main patterns in the fourth region. The second substrate is etched by using the patterned mask layer as a mask to form the first template.

According to an embodiment of the invention, in the patterning method, the method of forming the patterned mask layer may include the following steps. A mask layer is formed on the second substrate. The mask layer is patterned to form the patterned mask layer.

According to an embodiment of the invention, in the patterning method, the method of patterning the mask layer may include patterning the mask layer by using an electron beam.

According to an embodiment of the invention, the patterning method may further include the following step. After the first template is formed, the patterned mask layer is removed.

According to an embodiment of the invention, the patterning method may further include the following step. After the second template is formed, the first imprint layer is removed.

According to an embodiment of the invention, the patterning method may further include the following step. After the patterned material layer is formed, the second imprint layer is removed.

According to an embodiment of the invention, in the patterning method, the patterned material layer does not have patterns corresponding to the first dummy patterns.

According to an embodiment of the invention, in the patterning method, the first imprint layer may include imprint patterns complementary to the at least one first main pattern, the first dummy patterns, and the second main patterns.

According to an embodiment of the invention, in the patterning method, the at least one first main pattern, the first dummy patterns, and the second main patterns may be convex patterns. The imprint patterns may be first concave patterns. The second template may include template patterns corresponding to the imprint patterns. The template patterns may be second concave patterns.

According to an embodiment of the invention, in the patterning method, the depths of the template patterns corresponding to the first dummy patterns may be smaller than the depth of at least one of the template patterns corresponding to the at least one first main pattern.

According to an embodiment of the invention, in the above patterning method, the depths of the template patterns corresponding to the first dummy patterns may be smaller than the depths of the template patterns corresponding to the second main patterns.

According to an embodiment of the invention, in the patterning method, the second imprint layer may include imprint patterns complementary to template patterns of the second template.

According to an embodiment of the invention, in the patterning method, the template patterns of the second template may be concave patterns. The imprint patterns may be convex patterns.

According to an embodiment of the invention, in the patterning method, the heights of the imprint patterns corresponding to the first dummy patterns may be smaller than the height of at least one of the imprint patterns corresponding to the at least one first main pattern.

According to an embodiment of the invention, in the patterning method, the heights of the imprint patterns corresponding to the first dummy patterns may be smaller than the heights of the imprint patterns corresponding to the second main patterns.

Based on the above description, in the patterning method according to the invention, the density of the at least one first main pattern in the first region of the first template is less than the density of the second main patterns in the second region of the first template, and the first dummy patterns are located aside the at least one first main pattern. Therefore, the subsequently formed first imprint layer can have a uniform residual layer thickness, so the second template can have template patterns that conform to the expected critical dimension. Furthermore, since the first imprint layer can have imprint patterns complementary to the at least one first main pattern, the first dummy patterns, and the second main patterns, the second template can have template patterns corresponding to the at least one first main pattern, the first dummy patterns, and the second main patterns. In this way, the subsequently formed second imprint layer can have a uniform residual layer thickness, so the patterned material layer can have a pattern that conforms to the expected critical dimension. On the other hand, since the second template can be reused, the life time of the first template can be extended.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
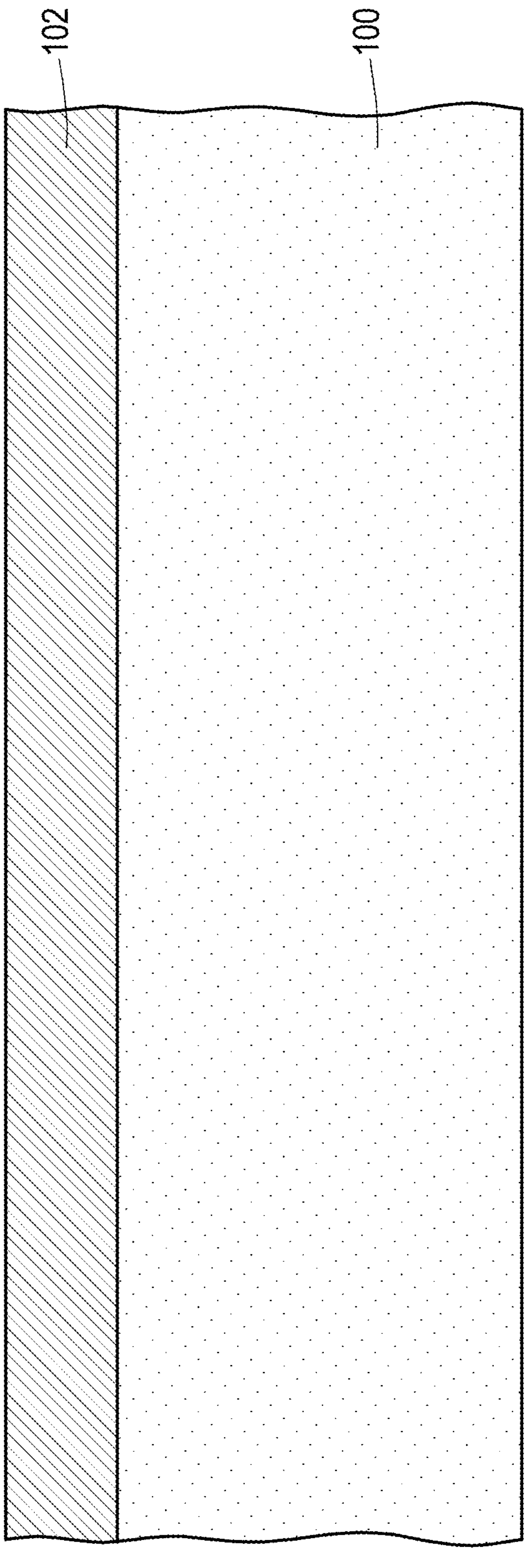
FIG. 1A to FIG. 1N are cross-sectional views of a patterning method according to some embodiments of the invention.
Figure 1B:
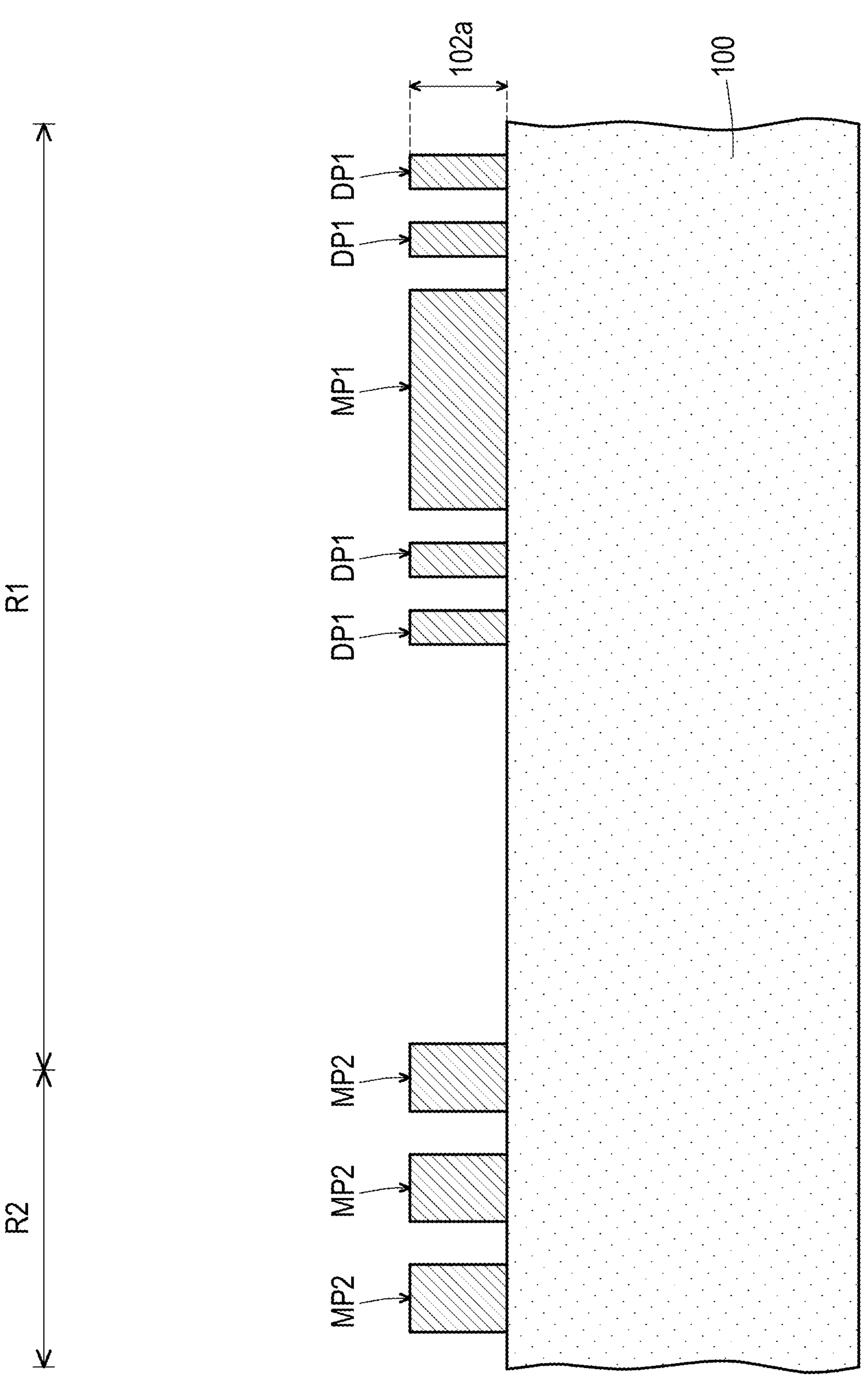
Figure 1C:
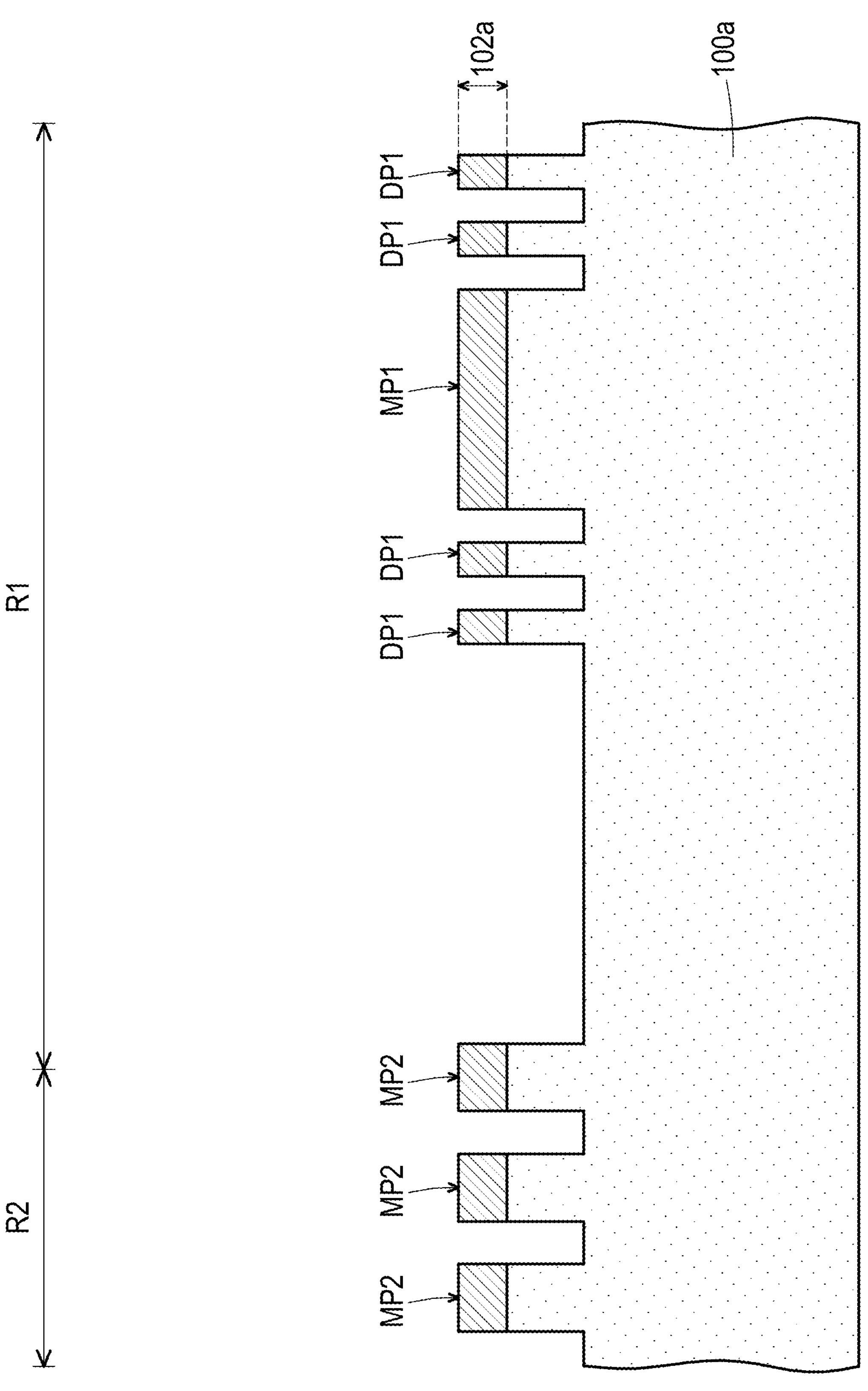
Figure 1D:
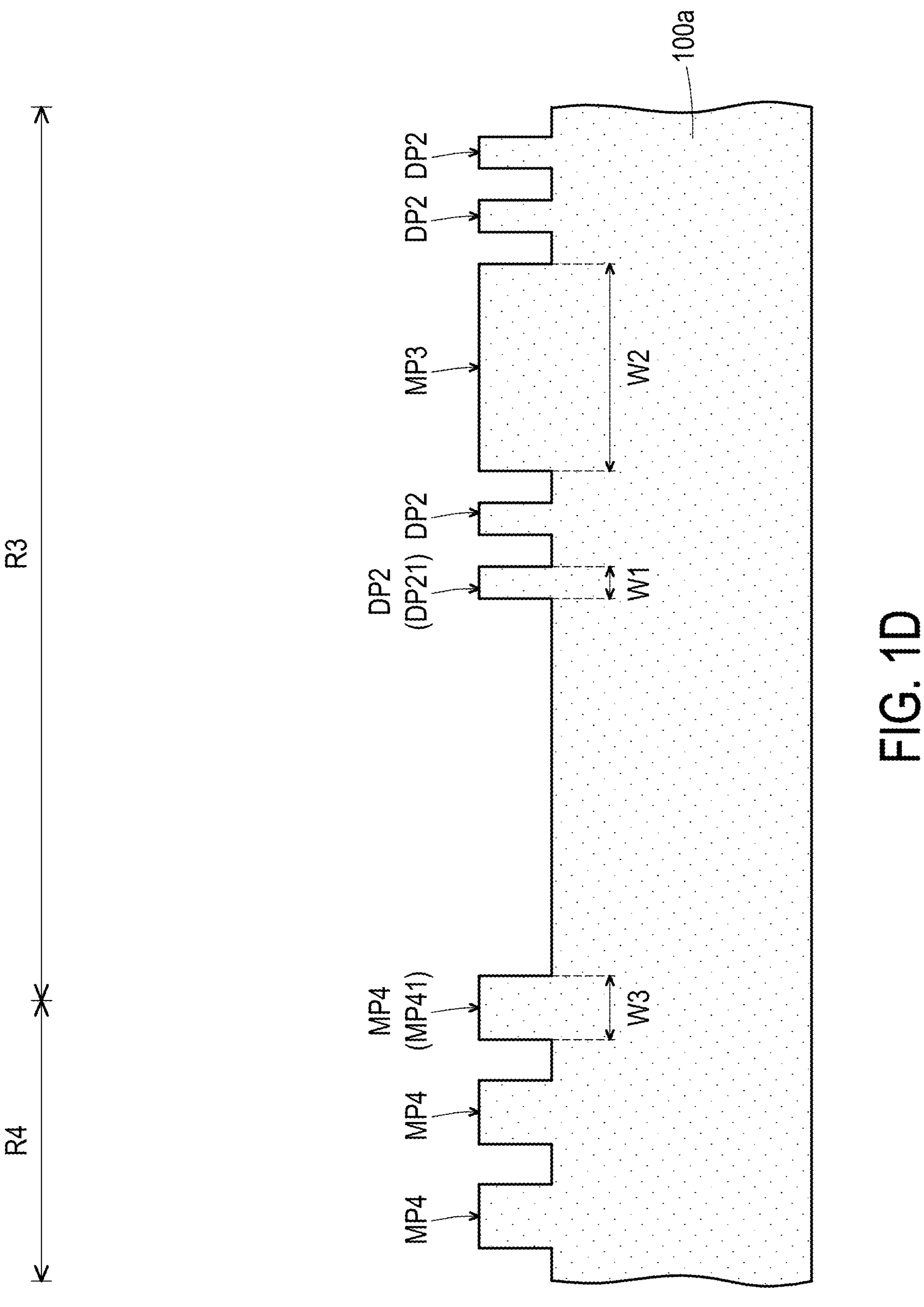
Figure 1E:
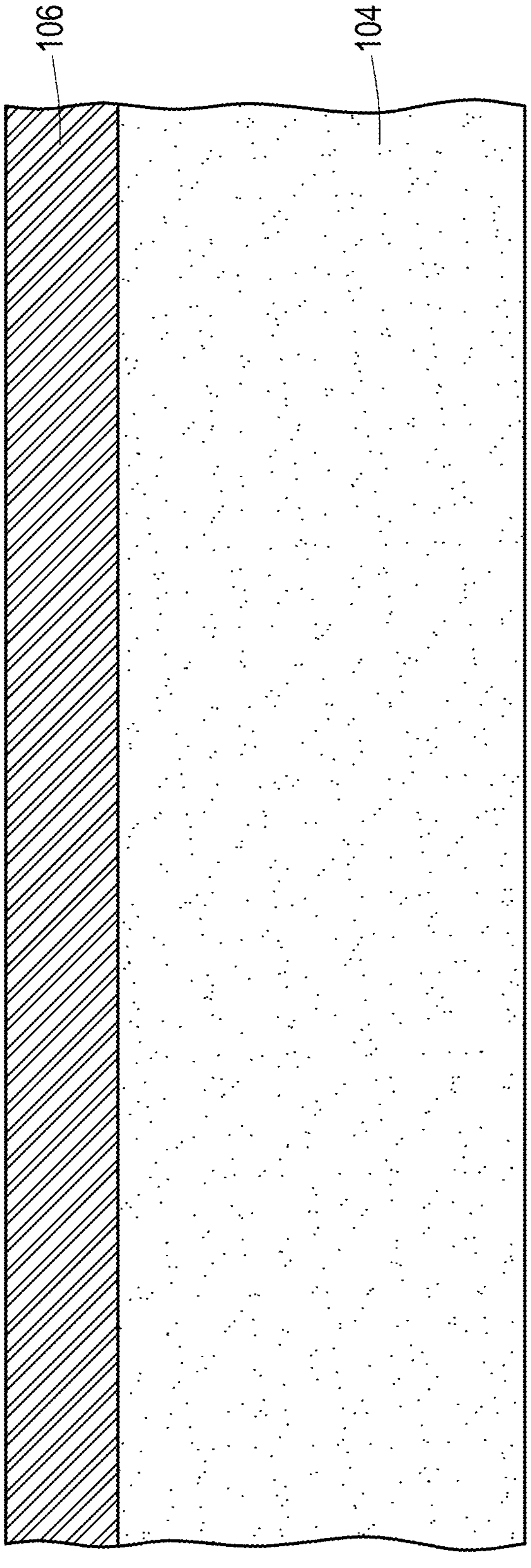
Figure 1F:
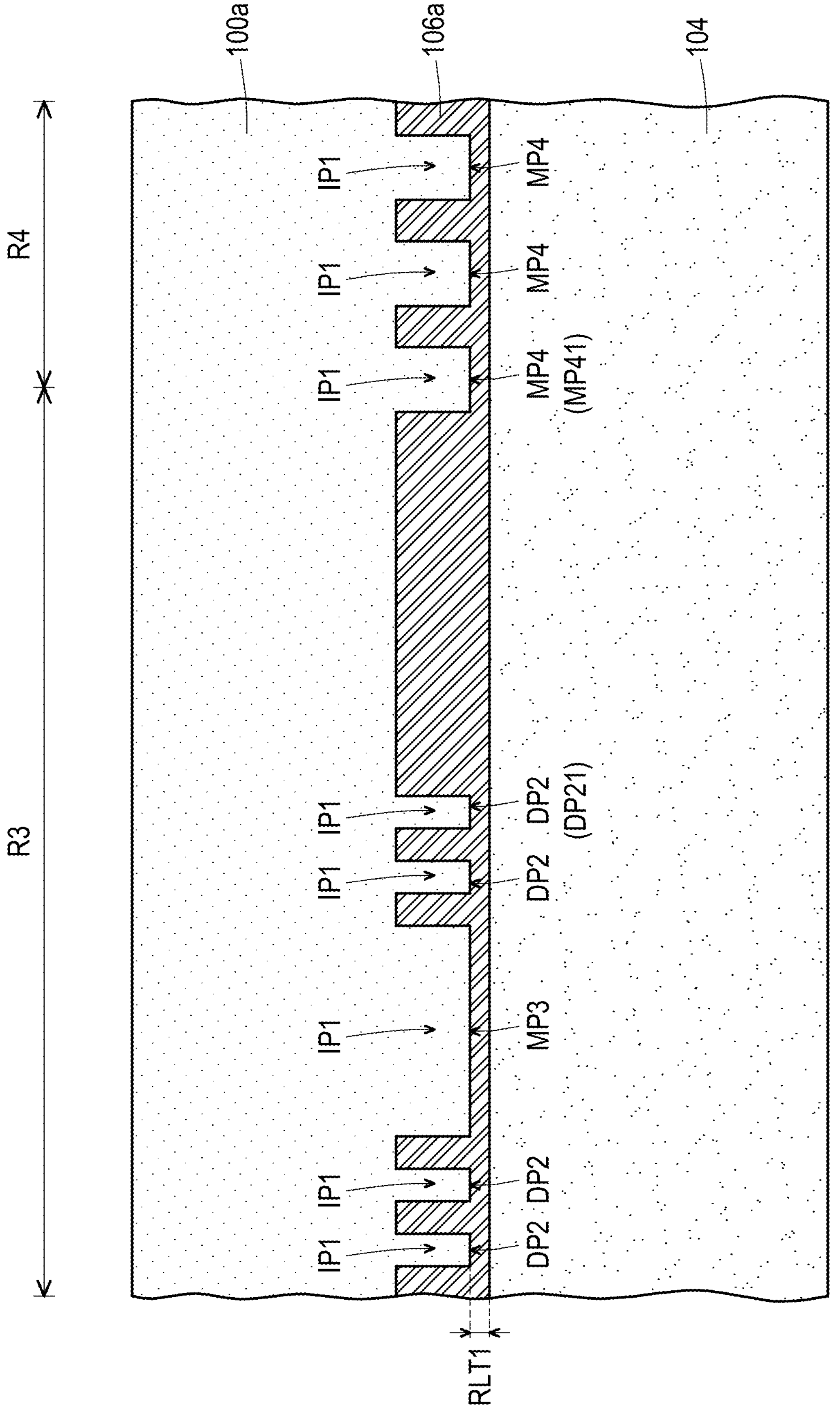
Figure 1G:
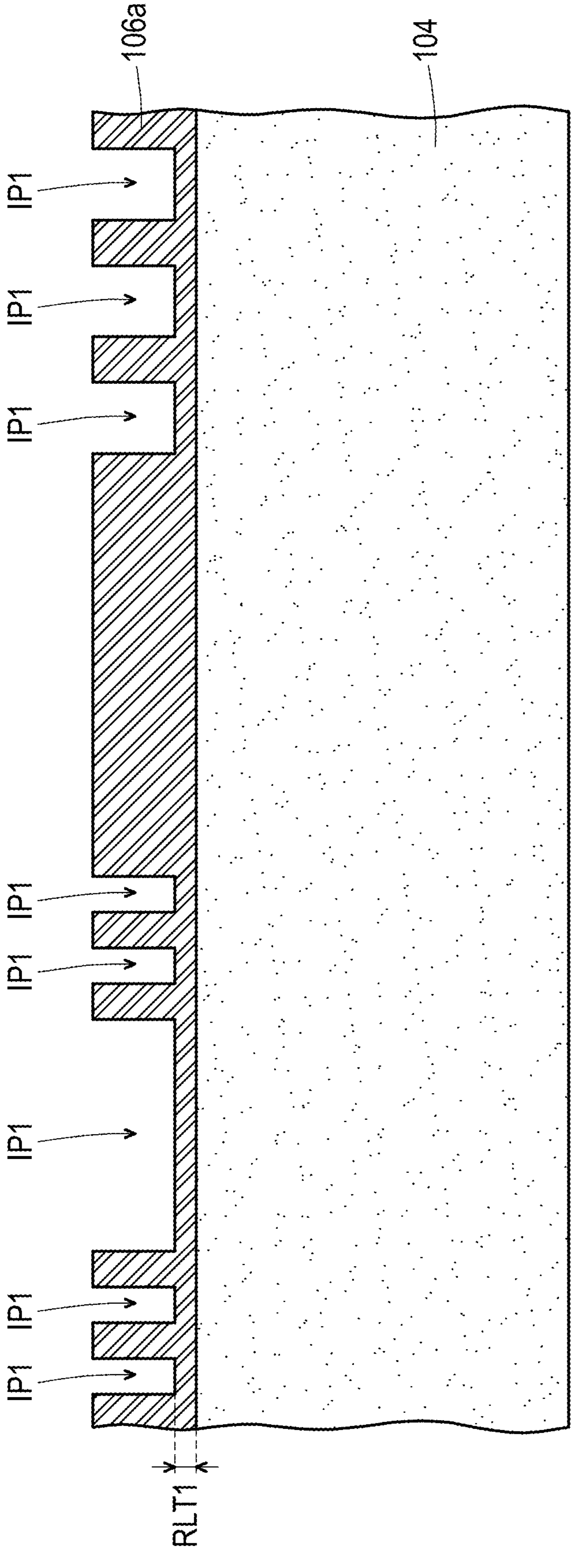
Figure 1H:
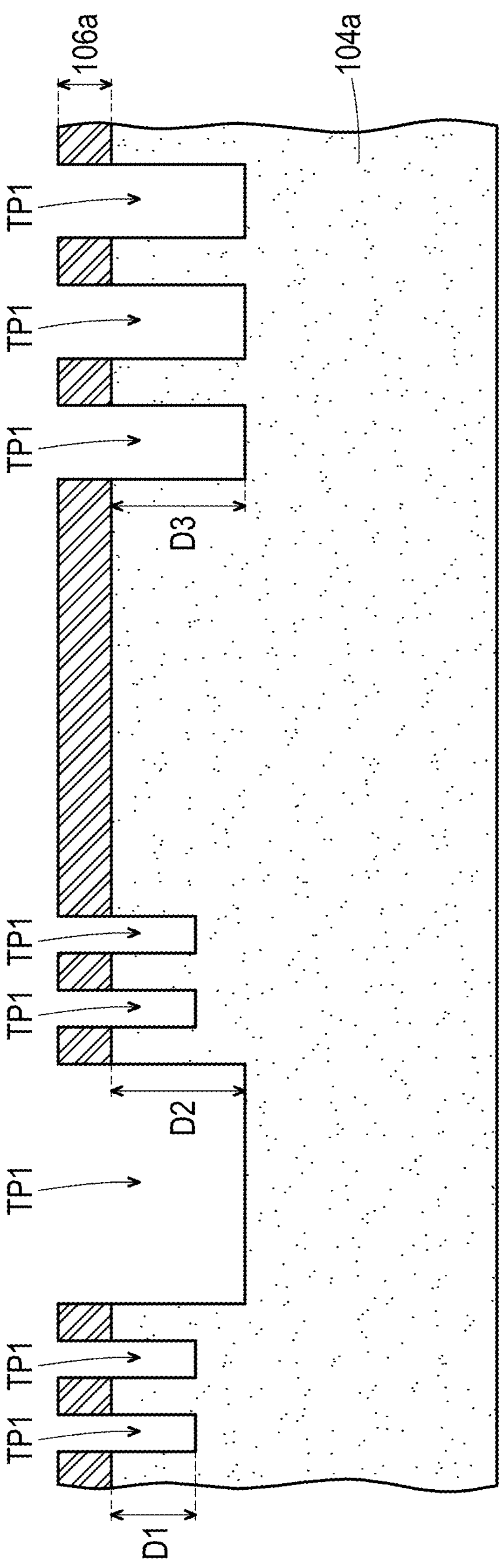
Figure 1I:
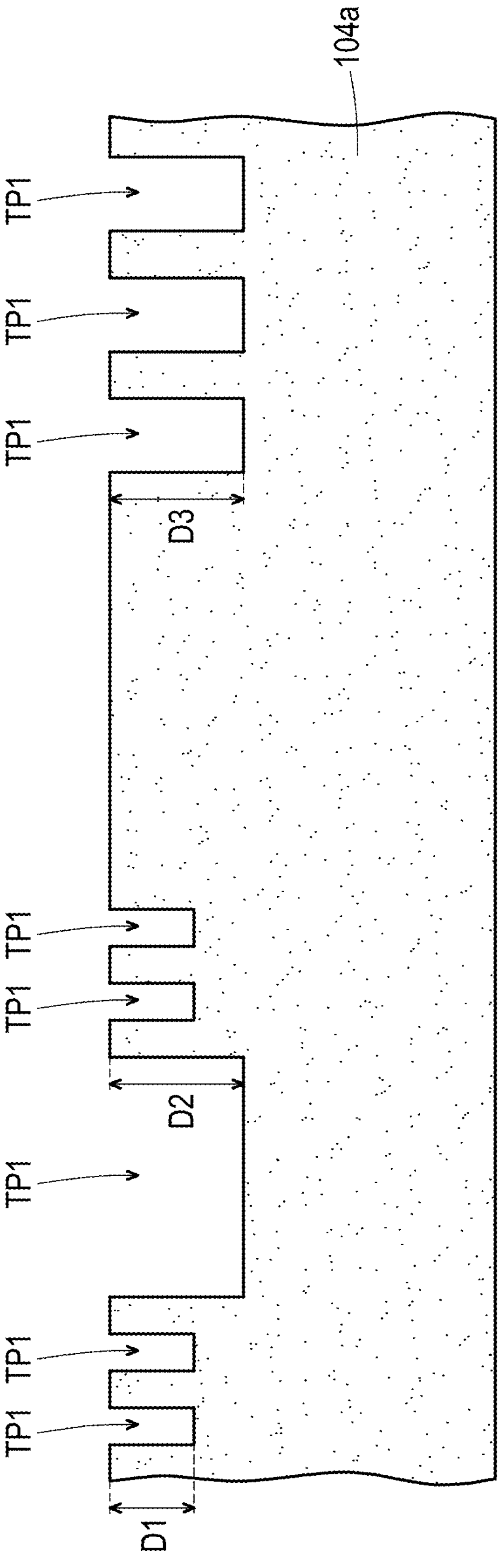
Figure 1J:
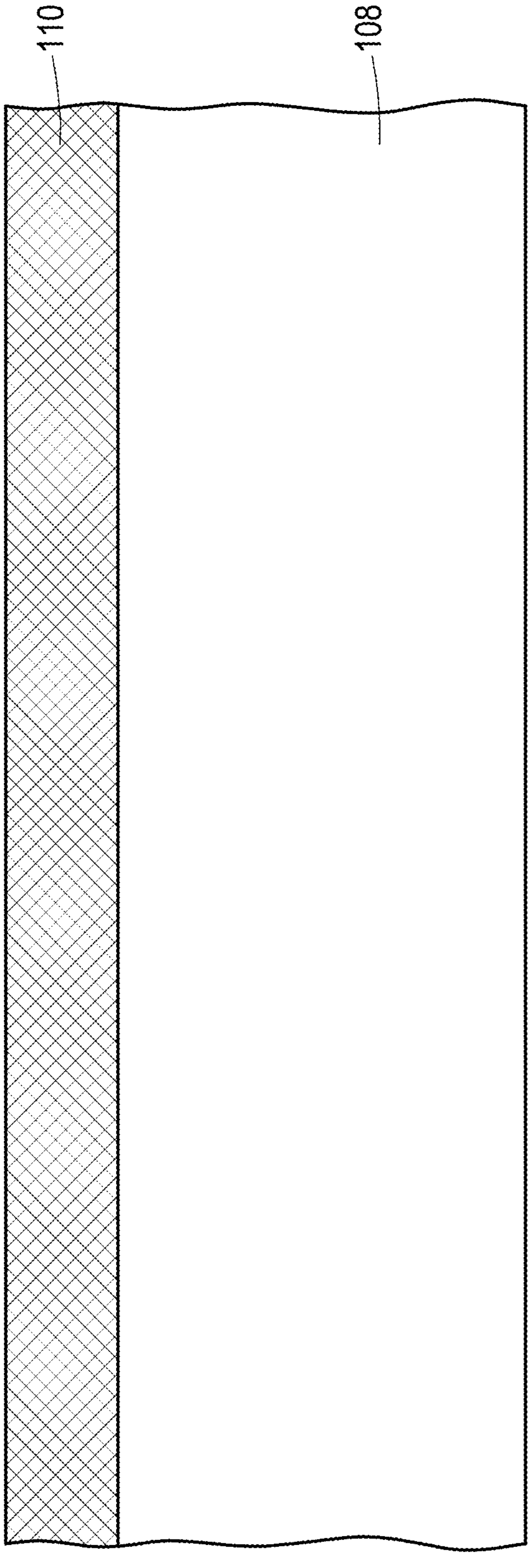
Figure 1K:
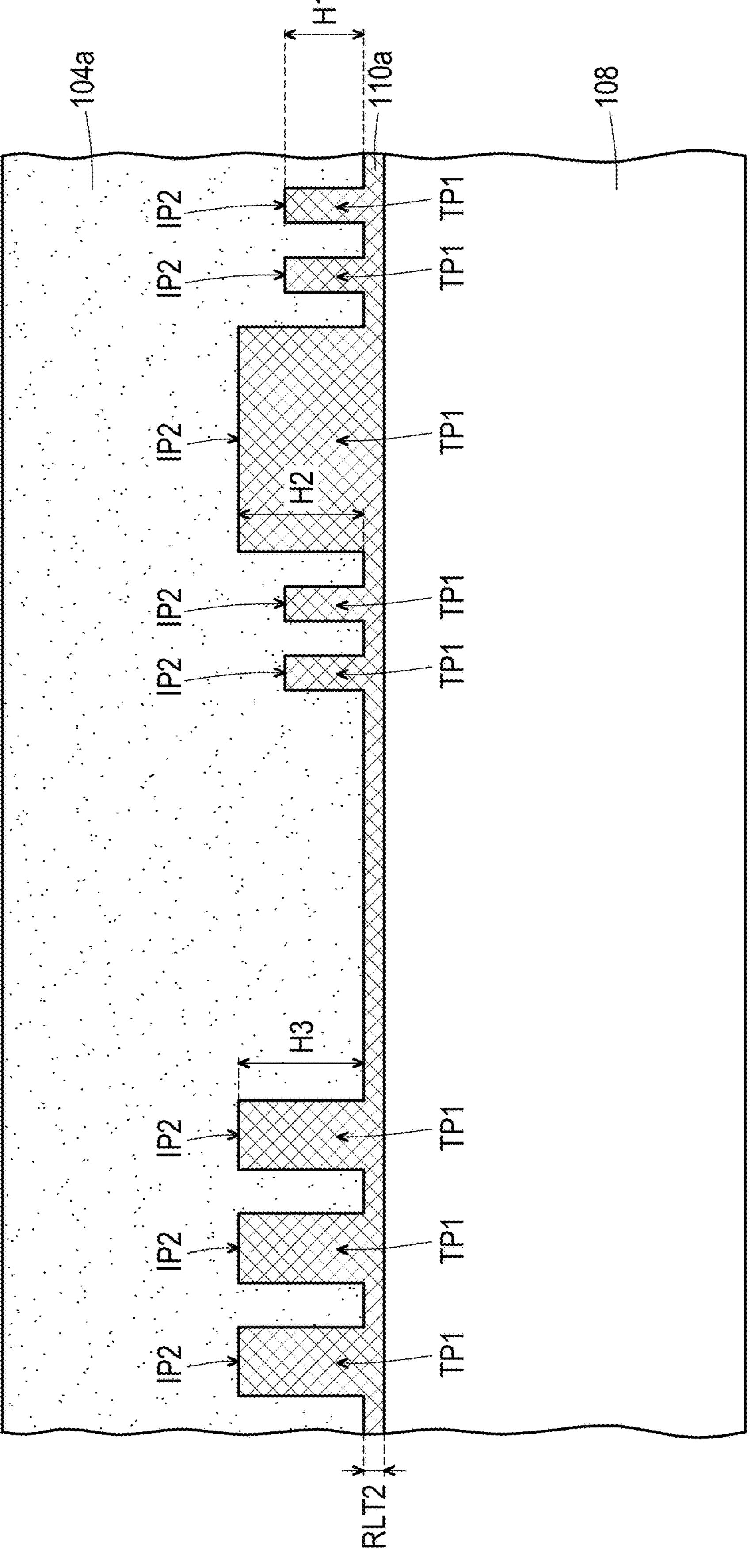
Figure 1L:
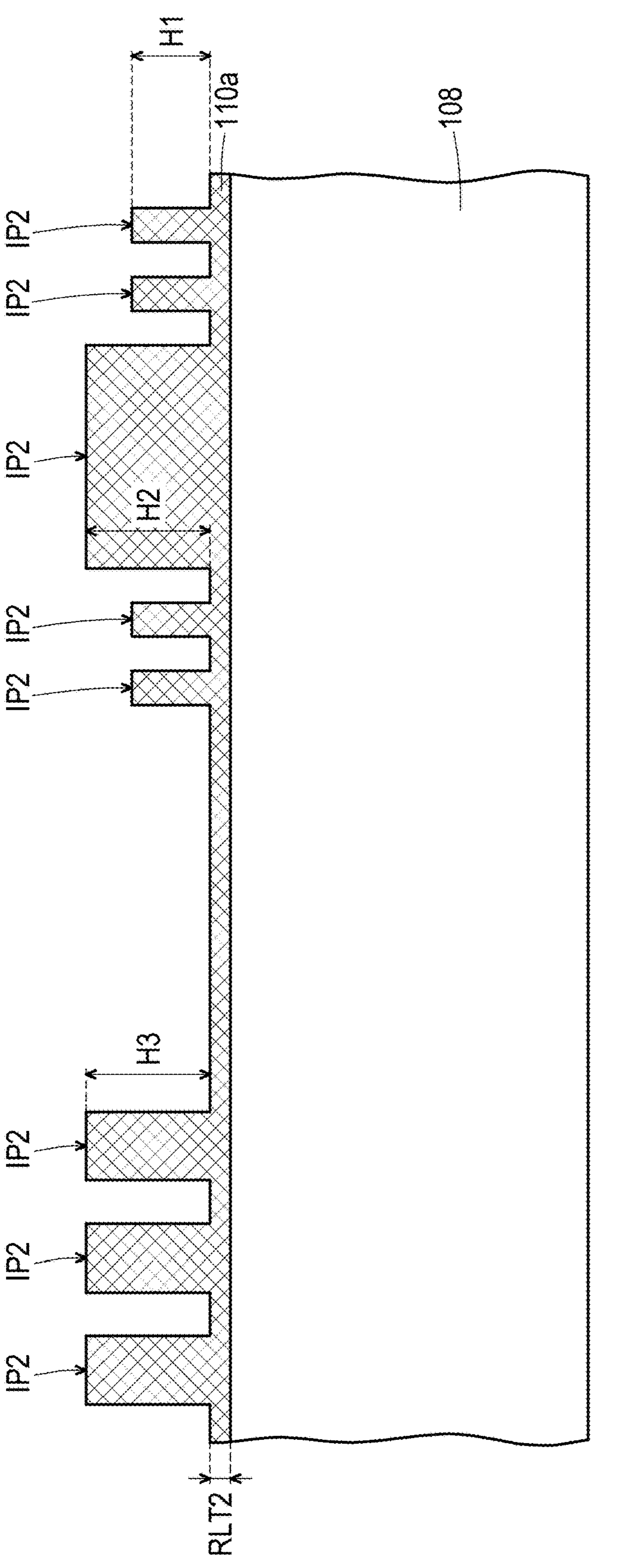
Figure 1M:
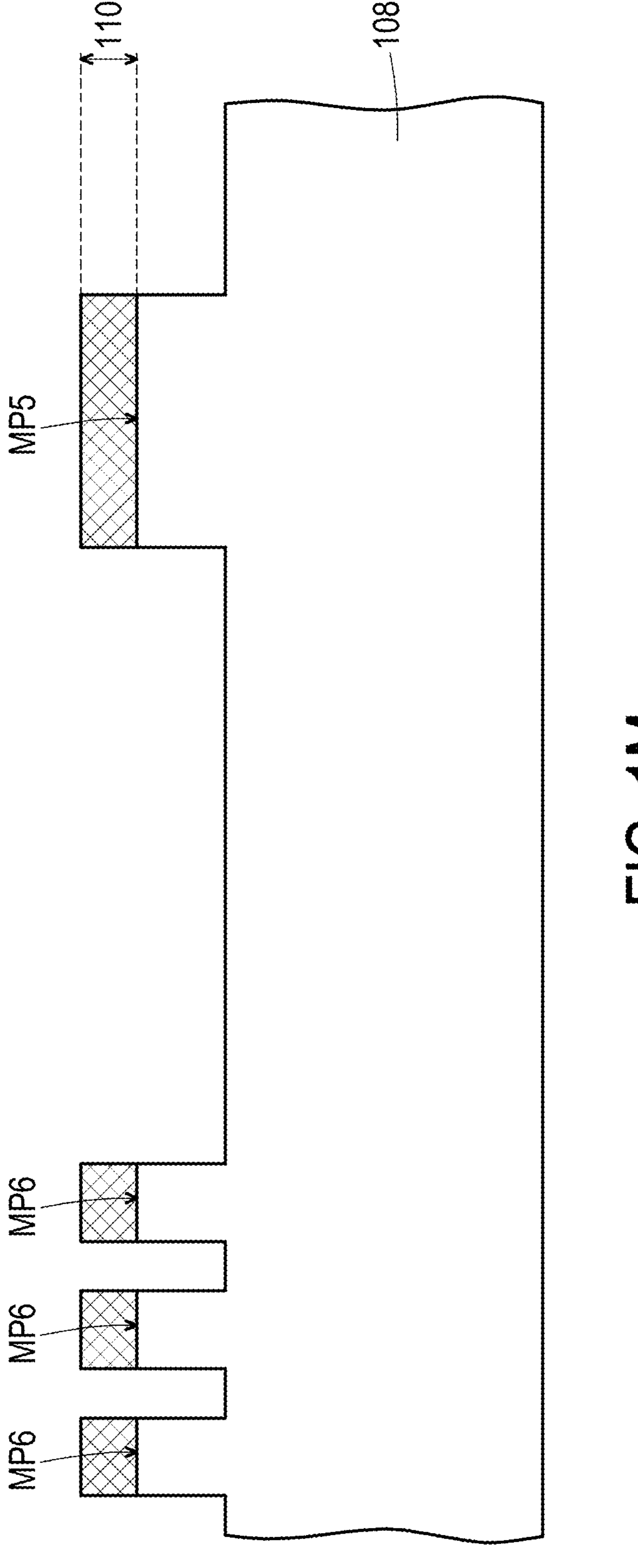
Figure 1N:
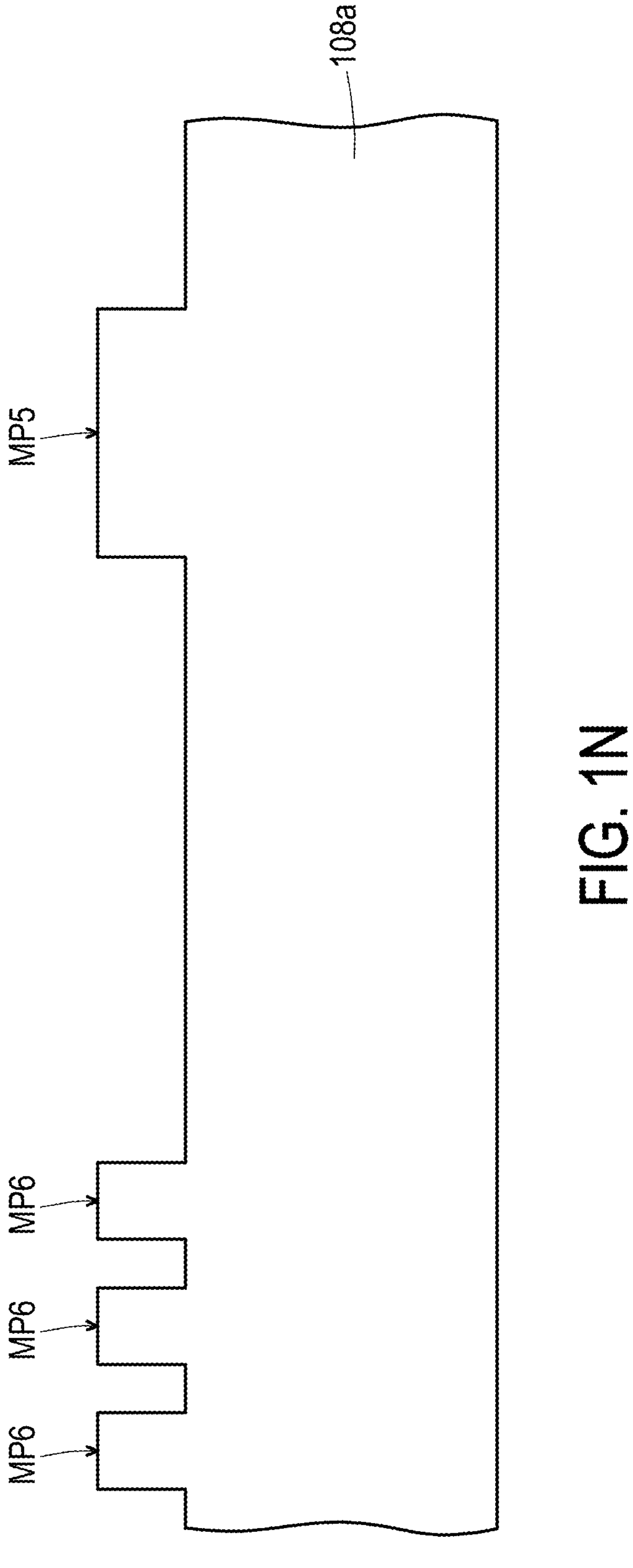

FIG. 1A to FIG. 1N are cross-sectional views of a patterning method according to some embodiments of the invention.

Referring to FIG. 1A, a substrate 100 is provided. In some embodiments, the material of the substrate 100 may be a material with high hardness, good heat resistance, and good chemical stability. In some embodiments, the substrate 100 is, for example, a silicon substrate or a glass substrate.

A mask layer 102 may be formed on the substrate 100. In some embodiments, the material of the mask layer 102 may be optical adhesive. In some embodiments, the material of the mask layer 102 may be a photosensitive polymer. In some embodiments, the method of forming the mask layer 102 is, for example, a spin coating method.

Referring to FIG. 1B, the mask layer 102 may be patterned to form a patterned mask layer 102*a*. Therefore, the patterned mask layer 102*a* may be formed on the substrate 100. The patterned mask layer 102*a* may include at least one main pattern MP1, dummy patterns DP1, and main pattern MP2. The at least one main pattern MP1 is located in the region R1 of the patterned mask layer 102*a*. The dummy patterns DP1 are located in the region R1 of the patterned mask layer 102*a*. The dummy patterns DP1 are located aside the at least one main pattern MP1. In some embodiments, the dummy patterns DP1 may be located on two sides of the at least one main pattern MP1. The main patterns MP2 are located in the region R2 of the patterned mask layer 102*a*. The density of the at least one main pattern MP1 in the region R1 may be less than the density of the main pattern MP2 in the region R2. That is, the number of main patterns MP1 per unit area in the region R1 may be less than the number of the main patterns MP2 per unit area in the region R2. In some embodiments, the region R1 may be an isolated region, and the region R2 may be a dense region. In addition, the number of the main patterns MP1, the number of dummy patterns DP1, and the number of main patterns MP2 are not limited to the number in the figure. As long as the number of the main patterns MP1 is at least one, the number of the dummy patterns DP1 is plural, and the number of the main patterns MP2 is plural, it falls within the scope of the invention. In some embodiments, the method of patterning the mask layer 102 may include patterning the mask layer 102 by using an electron beam.

Referring to FIG. 1C, the substrate 100 may be etched by using the patterned mask layer 102*a* as a mask to form a template 100*a*. In some embodiments, the method of etching the substrate 100 may include a dry etching method.

Referring to FIG. 1D, after the template 100*a* is formed, the patterned mask layer 102*a* may be removed. In some embodiments, the method of removing the patterned mask layer 102*a* is, for example, a dry stripping method or a wet stripping method.

By the above method, the template 100*a* may be provided. The template 100*a* includes at least one main pattern MP3, dummy patterns DP2, and main pattern MP4. The at least one main pattern MP3 is located in the region R3 of the template 100*a*. The at least one main pattern MP3 may correspond to the at least one main pattern MP1. The dummy patterns DP2 are located in the region R3 of the template 100a. The dummy patterns DP2 are located aside the at least one main pattern MP3. In some embodiments, the dummy patterns DP2 may be located on two sides of the at least one main pattern MP3. The dummy patterns DP2 may correspond to the dummy patterns DP1. The main patterns MP4 are located in the region R4 of the template 100a. The main patterns MP4 may correspond to the main patterns MP2. The density of the at least one main pattern MP3 in the region R3 is less than the density of the main patterns MP4 in the region R4. That is, the number of the main patterns MP3 per unit area in the region R3 may be less than the number of the main patterns MP4 per unit area in the region R4. In some embodiments, the region R3 may be an isolated region, and the region R4 may be a dense region. In addition, the number of the main patterns MP3, the number of the dummy patterns DP2, and the number of the main patterns MP4 are not limited to the number in the figure. As long as the number of the main patterns MP3 is at least one, the number of the dummy patterns DP2 is plural, and the number of the main patterns MP4 is plural, it falls within the scope of the invention.

In some embodiments, the at least one main pattern MP3, the dummy patterns DP2, and the main patterns MP4 may be convex patterns. In some embodiments, the critical dimension (e.g., width W1) of each of the dummy patterns DP2 may be smaller than the critical dimension (e.g., width W2) of the at least one main pattern MP3 and the critical dimension (e.g., width W3) of each of the main patterns MP4. In the present embodiment, all the dummy patterns DP2 may be closer to the at least one main pattern MP3 than to the main patterns MP4. For example, the dummy pattern DP21 may be closer to the main pattern MP3 than to the main pattern MP41.

Referring to FIG. 1E, an imprint material 106 is provided on a substrate 104. In some embodiments, the material of the substrate 104 is, for example, a polymer material. In some embodiments, the material of the imprint material 106 may be optical adhesive. In some embodiments, the imprint material 106 may be a photosensitive polymer. In some embodiments, the method of forming the imprint material 106 is, for example, a spin coating method or an inkjet method.

Referring to FIG. 1F, the imprint material 106 is imprinted by using the template 100a to form an imprint layer 106a. Since the density of the at least one main pattern MP3 in the region R3 of the template 100a is less than the density of the main patterns MP4 in the region R4 of the template 100a, and the dummy patterns DP2 are located aside the at least one main pattern MP3, the imprint layer 106a can have a uniform residual layer thickness RLT1. In some embodiments, the imprint layer 106a may include imprint patterns IP1 complementary to the at least one main pattern MP3, the dummy patterns DP2, and the main patterns MP4. In some embodiments, the imprint patterns IP1 may be concave patterns.

Referring to FIG. 1G, the template 100a and the imprint layer 106a may be separated. Referring to FIG. 1H, the substrate 104 is etched by using the imprint layer 106a as a mask to form a template 104a. The template 104a may include template patterns TP1 corresponding to the imprint patterns IP1. Since the imprint layer 106a can have a uniform residual layer thickness RLT1, the template 104a can have the template patterns TP1 that conform to the expected critical dimension. In addition, since the imprint layer 106a can have the imprint patterns IP1 complementary to the at least one main pattern MP3, the dummy patterns DP2, and the main patterns MP4, the template 104a can have the template patterns TP1 corresponding to the at least one main pattern MP3, the dummy patterns DP2, and the main patterns MP4. In some embodiments, the template patterns TP1 may be concave patterns. In some embodiments, since the critical dimension (e.g., width W1) of each of the dummy patterns DP2 may be smaller than the critical dimension (e.g., width W2) of the at least one main pattern MP3, the depths D1 of the template patterns TP1 corresponding to the dummy patterns DP2 may be smaller than the depth D2 of the at least one of the template patterns TP1 corresponding to the at least one main pattern MP3. In some embodiments, since the critical dimension (e.g., width W1) of each of the dummy patterns DP2 may be smaller than the critical dimension (e.g., width W3) of each of the main patterns MP4, the depths D1 of the template patterns TP1 corresponding to the dummy patterns DP2 may be smaller than the depths D3 of the template patterns TP1 corresponding to the main patterns MP4. In some embodiments, the method of etching the substrate 104 may include a dry etching method.

Referring to FIG. 1I, after the template 104a is formed, the imprint layer 106a may be removed. In some embodiments, the method of removing the imprint layer 106a is, for example, a dry stripping method or a wet stripping method.

Referring to FIG. 1J, an imprint material 110 is provided on a material layer 108. In some embodiments, the material layer 108 may be a wafer (e.g., semiconductor wafer) or a dielectric layer or a conductive layer located on the wafer. In some embodiments, the imprint material 110 may be optical adhesive. In some embodiments, the imprint material 110 may be a photosensitive polymer. In some embodiments, the method of forming the imprint material 110 is, for example, a spin coating method or an inkjet method.

Referring to FIG. 1K, the imprint material 110 is imprinted by using the template 104a to form an imprint layer 110a. Since the template 104a can have the template patterns TP1 corresponding to the at least one main pattern MP3, the dummy patterns DP2, and the main patterns MP4, the imprint layer 110a can have a uniform residual layer thickness RLT2. In addition, since the template 104a can be reused, the life time of the template 100a can be extended. In some embodiments, the imprint layer 110a may include imprint patterns IP2 complementary to the template patterns TP1 of the template 104a. In some embodiments, since the template patterns TP1 of the template 104a may be concave patterns, the imprint patterns IP2 may be convex patterns. In some embodiments, the heights H1 of the imprint patterns IP2 corresponding to the dummy patterns DP2 may be smaller than the height H2 of at least one of the imprint patterns IP2 corresponding to the at least one main pattern MP3. In some embodiments, the heights H1 of the imprint patterns IP2 corresponding to the dummy patterns DP2 may be smaller than the heights H3 of the imprint patterns IP2 corresponding to the main patterns MP4.

Referring to FIG. 1L, the template 104a and the imprint layer 110a may be separated. Referring to FIG. 1M, the material layer 108 is etched by using the imprint layer 110a as a mask to form a patterned material layer 108a. The patterned material layer 108a includes at least one main pattern MP5 corresponding to the at least one main pattern MP3 and main patterns MP6 corresponding to the main patterns MP4. Since the imprint layer 110a can have a uniform residual layer thickness RLT2, the patterned material layer 108a may have a pattern (e.g., main pattern MP5 and main pattern MP4) that conforms to the expected critical dimension. In some embodiments, since the imprint patterns IP2 corresponding to the dummy patterns DP2 have a lower height (e.g., height H1), in the above etching process, the imprint patterns IP2 corresponding to the dummy patterns DP2 will be removed first, and the patterns of the imprint patterns IP2 corresponding to the dummy patterns DP2 will not be transferred to the material layer 108. As a result, the patterned material layer 108*a* does not have patterns corresponding to the dummy patterns DP2. In some embodiments, the method of etching the material layer 108 may include a dry etching method.

Referring to FIG. 1N, after the patterned material layer 108*a* is formed, the imprint layer 110*a* is removed. In some embodiments, the method of removing the imprint layer 110*a* is, for example, a dry stripping method or a wet stripping method.

Based on the above embodiments, in the above patterning method, the density of the at least one main pattern MP3 in the region R3 of the template 100*a* is less than the density of the main patterns MP4 in the region R4 of the template 100*a*, and the dummy patterns DP2 are located aside the at least one main pattern MP3. Therefore, the subsequently formed imprint layer 106*a* can have a uniform residual layer thickness RLT1, so the template 104*a* can have the template patterns TP1 that conform the expected critical dimension. Furthermore, since the imprint layer 106*a* can have the imprint patterns IP1 complementary to the at least one main pattern MP3, the dummy patterns DP2, and the main patterns MP4, the template 104*a* can have the template patterns TP1 corresponding to the at least one main pattern MP3, the dummy patterns DP2, and the main patterns MP4. In this way, the subsequently formed imprint layer 110*a* can have a uniform residual layer thickness RLT2, so the patterned material layer 108*a* can have a pattern that conforms the expected critical dimension. On the other hand, since the template 104*a* can be reused, the life time of the template 100*a* can be extended.

Figure 2A:
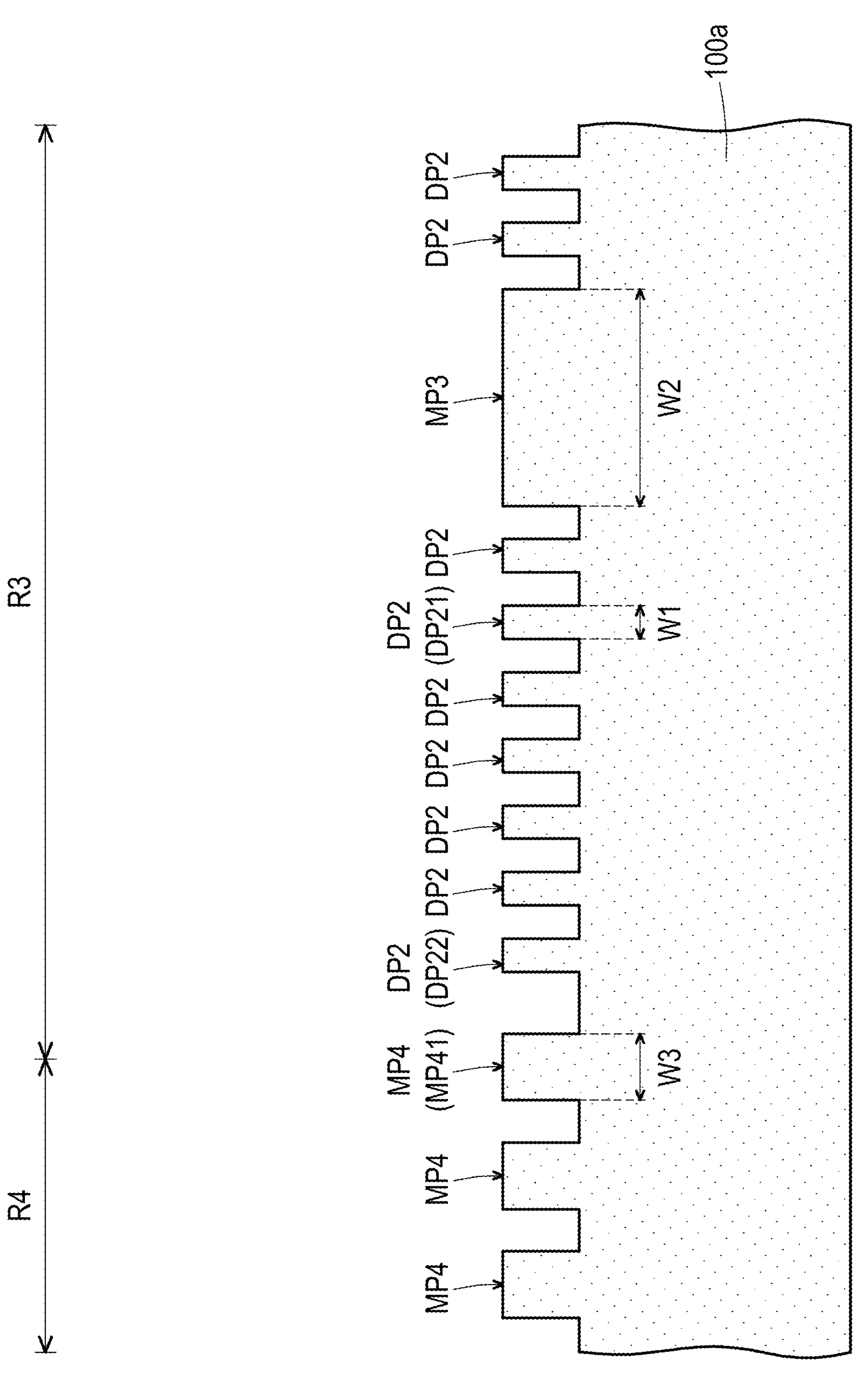
FIG. 2A to FIG. 2B are cross-sectional views of a patterning method according to some embodiments of the invention.
Figure 2B:
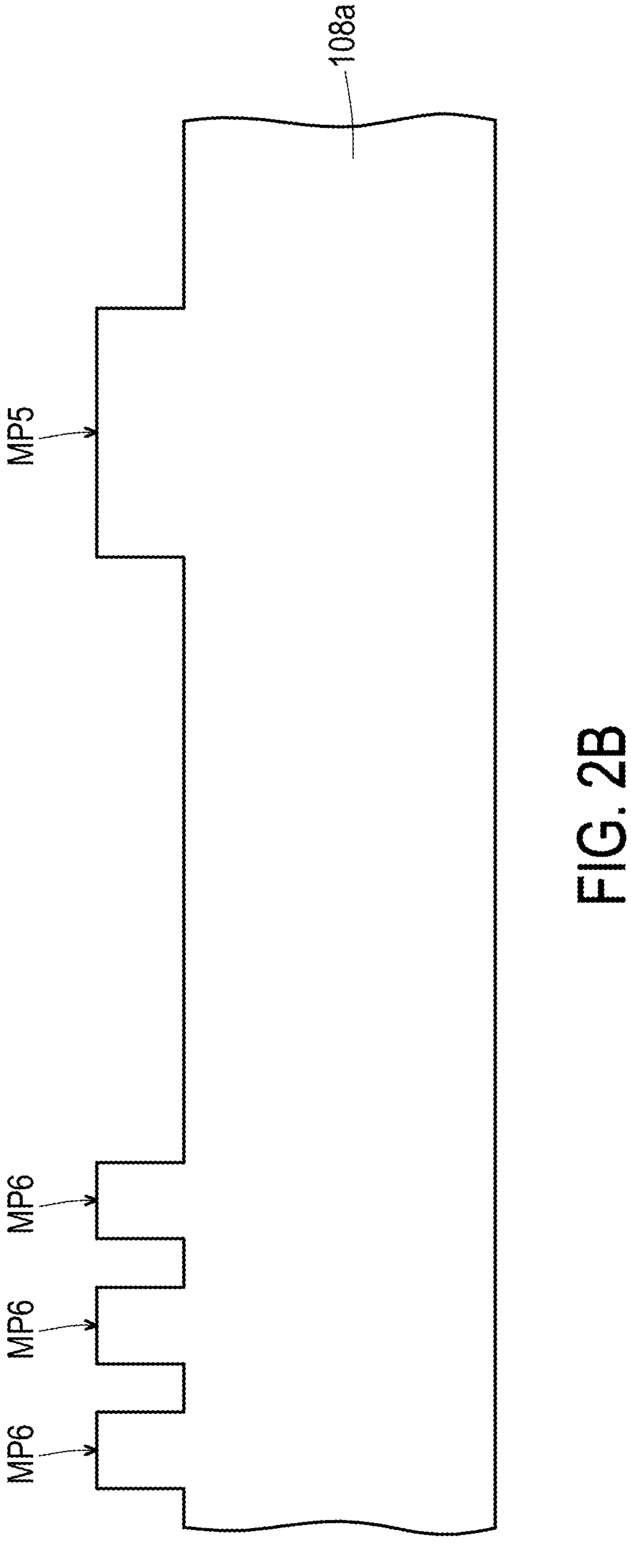

FIG. 2A to FIG. 2B are cross-sectional views of a patterning method according to some embodiments of the invention.

Referring to FIG. 2A, a template 100*a* is provided. The differences between the template 100*a* in FIG. 2A and the template 100*a* in FIG. 1D are as follows. In FIG. 2A, a portion of the dummy patterns DP2 may be closer to the at least one main pattern MP3 than to the main patterns MP4. For example, in FIG. 2A, the dummy pattern DP21 may be closer to the main pattern MP3 than to the main pattern MP41. In FIG. 2A, another portion of the dummy patterns DP2 may be closer to the main patterns MP4 than to the at least one main pattern MP3. For example, in FIG. 2A, the dummy pattern DP22 may be closer to the main pattern MP41 than to the main pattern MP3. In addition, the formation method of the template 100*a* in FIG. 2A may refer to the formation method of the template 100*a* in FIG. 1A to FIG. 1D, and the description thereof is omitted. In addition, in FIG. 1D and FIG. 2A, the same or similar components are denoted by the same reference symbols, and the description thereof is omitted.

Then, the template 100*a* may be used to perform the steps of FIG. 1E to FIG. 1N to form a patterned material layer 108*a* as shown in FIG. 2B, and the description thereof is omitted. In addition, in FIG. 1N and FIG. 2B, the same or similar components are denoted by the same reference symbols, and the description thereof is omitted.

In summary, the patterning method of the aforementioned embodiments includes the following steps. A first template is provided. The first template includes at least one first main pattern, first dummy patterns, and second main patterns. The at least one first main pattern is located in the first region of the first template. The first dummy patterns are located in the first region of the first template. The first dummy patterns are located aside the at least one first main pattern. The second main patterns are located in the second region of the first template. The density of the at least one first main pattern in the first region is less than the density of the second main patterns in the second region. A first imprint material is provided on a first substrate. The first imprint material is imprinted by using the first template to form a first imprint layer. The first substrate is etched by using the first imprint layer as a mask to form a second template. A second imprint material is provided on a material layer. The second imprint material is imprinted by using the second template to form a second imprint layer. The material layer is etched by using the second imprint layer as a mask to form a patterned material layer. The patterned material layer includes at least one third main pattern corresponding to the at least one first main pattern and fourth main patterns corresponding to the second main patterns. Since the density of the at least one first main pattern in the first region of the first template is less than the density of the second main patterns in the second region of the first template, and the first dummy patterns are located aside the at least one first main pattern, the subsequently formed first imprint layer can have a uniform residual layer thickness, so the second template can have template patterns that conform to the expected critical dimension. Furthermore, since the first imprint layer can have imprint patterns complementary to the at least one first main pattern, the first dummy patterns, and the second main patterns, the second template can have template patterns corresponding to the at least one first main pattern, the first dummy patterns, and the second main patterns. In this way, the subsequently formed second imprint layer can have a uniform residual layer thickness, so the patterned material layer can have a pattern that conforms to the expected critical dimension. On the other hand, since the second template can be reused, the life time of the first template can be extended.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A patterning method, comprising:

providing a first template, wherein the first template comprises:

at least one first main pattern located in a first region of the first template;

first dummy patterns located in the first region of the first template and located aside the at least one first main pattern; and second main patterns located in a second region of the first template, wherein a density of the at least one first main pattern in the first region is less than a density of the second main patterns in the second region;

providing a first imprint material on a first substrate;

imprinting the first imprint material by using the first template to form a first imprint layer;

etching the first substrate by using the first imprint layer as a mask to form a second template;

providing a second imprint material on a material layer;

imprinting the second imprint material by using the second template to form a second imprint layer; and etching the material layer by using the second imprint layer as a mask to form a patterned material layer, wherein the patterned material layer comprises at least one third main pattern corresponding to the at least one first main pattern and fourth main patterns corresponding to the second main patterns.

2. The patterning method according to claim 1, wherein a critical dimension of each of the first dummy patterns is smaller than a critical dimension of the at least one first main pattern and a critical dimension of each of the second main patterns.

3. The patterning method according to claim 1, wherein the first dummy patterns are located on two sides of the at least one first main pattern.

4. The patterning method according to claim 1, wherein all the first dummy patterns are closer to the at least one first main pattern than to the second main patterns.

5. The patterning method according to claim 1, wherein a portion of the first dummy patterns is closer to the at least one first main pattern than to the second main patterns, and another portion of the first dummy patterns is closer to the second main patterns than to the at least one first main pattern.

6. The patterning method according to claim 1, wherein a method of forming the first template comprises:

providing a second substrate;

forming a patterned mask layer on the second substrate, wherein the patterned mask layer comprises:

at least one fifth main pattern located in a third region of the patterned mask layer, wherein the at least one first main pattern corresponds to the at least one fifth main pattern;

second dummy patterns located in the third region of the patterned mask layer and located aside the at least one fifth main pattern, wherein the first dummy patterns correspond the second dummy patterns; and sixth main patterns located in a fourth region of the patterned mask layer, wherein the second main patterns correspond to the sixth main patterns, and a density of the at least one fifth main pattern in the third region is less than a density of the sixth main patterns in the fourth region; and etching the second substrate by using the patterned mask layer as a mask to form the first template.

7. The patterning method according to claim 6, wherein a method of forming the patterned mask layer comprises:

forming a mask layer on the second substrate; and patterning the mask layer to form the patterned mask layer.

8. The patterning method according to claim 7, wherein a method of patterning the mask layer comprises patterning the mask layer by using an electron beam.

9. The patterning method according to claim 6, further comprising:

removing the patterned mask layer after forming the first template.

10. The patterning method according to claim 1, further comprising:

removing the first imprint layer after forming the second template.

11. The patterning method according to claim 1, further comprising:

removing the second imprint layer after forming the patterned material layer.

12. The patterning method according to claim 1, wherein the patterned material layer does not have patterns corresponding to the first dummy patterns.

13. The patterning method according to claim 1, wherein the first imprint layer comprises imprint patterns complementary to the at least one first main pattern, the first dummy patterns, and the second main patterns.

14. The patterning method according to claim 13, wherein the at least one first main pattern, the first dummy patterns, and the second main patterns comprise convex patterns, the imprint patterns comprise first concave patterns, the second template comprises template patterns corresponding to the imprint patterns, and the template patterns comprise second concave patterns.

15. The patterning method according to claim 14, wherein depths of the template patterns corresponding to the first dummy patterns are smaller than a depth of at least one of the template patterns corresponding to the at least one first main pattern.

16. The patterning method according to claim 14, wherein depths of the template patterns corresponding to the first dummy patterns are smaller than depths of the template patterns corresponding to the second main patterns.

17. The patterning method according to claim 1, wherein the second imprint layer comprises imprint patterns complementary to template patterns of the second template.

18. The patterning method according to claim 17, wherein the template patterns of the second template comprise concave patterns, and the imprint patterns comprise convex patterns.

19. The patterning method according to claim 18, wherein heights of the imprint patterns corresponding to the first dummy patterns are smaller than a height of at least one of the imprint patterns corresponding to the at least one first main pattern.

20. The patterning method according to claim 18, wherein heights of the imprint patterns corresponding to the first dummy patterns are smaller than heights of the imprint patterns corresponding to the second main patterns.

* * * * *